United States Patent [19]

Ieki

[11] 4,354,129
[45] Oct. 12, 1982

[54] ABSORBER FOR PIEZOELECTRIC SURFACE ACOUSTIC WAVE DEVICE

[75] Inventor: Hideharu Ieki, Nagaokakyo, Japan

[73] Assignee: Murata Manufacturing Co., Ltd., Japan

[21] Appl. No.: 140,857

[22] Filed: Apr. 16, 1980

[30] Foreign Application Priority Data

Apr. 28, 1979 [JP] Japan .................................. 54/52874

[51] Int. Cl.³ .......................................... H01L 41/08
[52] U.S. Cl. ............................ 310/313 C; 310/313 B; 310/326; 333/151
[58] Field of Search ........... 310/313 B, 313 C, 313 D, 310/326; 333/151, 194

[56] References Cited

U.S. PATENT DOCUMENTS

| 4,013,834 | 3/1977 | Kino ..................................... 310/313 |
| 4,090,153 | 5/1978 | Toda et al. ........................... 310/313 |
| 4,096,455 | 6/1978 | Drummond ......................... 310/313 |
| 4,139,791 | 2/1979 | Yamada ............................... 310/313 |

FOREIGN PATENT DOCUMENTS 54-12545 1/1979 Japan .................................. 310/313

*Primary Examiner*—Mark O. Budd

[57] ABSTRACT

A surface acoustic wave device includes a piezoelectric substrate, transmitting and receiving transducers provided on the surface of the substrate for propagating acoustic waves between the transducers, and absorbers provided between an end of the substrate and respective transducers for absorbing unwanted acoustic waves. The shape of the absorber is in relation to the energy distribution of the acoustic waves.

8 Claims, 7 Drawing Figures

ENERGY

ABSORBER FOR PIEZOELECTRIC SURFACE ACOUSTIC WAVE DEVICE

BACKGROUND OF THE INVENTION

The present invention relates to a surface acoustic wave device for use in communication system, such as filter, and more particularly, to a surface acoustic wave device provided with an absorber for absorbing and suppressing reflected waves.

Generally, a surface acoustic wave (SAW) device comprises, as shown in FIG. 1, a transmitting, or launching, transducer 2 and a receiving transducer 4, which are formed from interdigitated comb-like multi-electrode elements and disposed on a piezoelectric substrate 6. When an alternating electrical potential is applied to the electrodes of the transmitting transducer 2 through terminal plates 8 and 10 located at opposite side of the transducer 2, an alternating electric field is generated that causes localized vibrations in the substrate material 6. These vibrations give rise to acoustic waves, which propagate along the surface of the substrate in a well defined path orthogonal to the electrodes, and may be detected at any point along the path by the receiving transducer 4. The received acoustic waves can be removed as an electric signal, from terminal plates 12 and 14.

In the SAW device described above, the transmitting transducer 2 launches the surface waves in opposite directions simultaneously while the receiving transducer 4 receives the waves traveling in either direction. This is a significant problem in most SAW devices because in addition to responding to surface waves traveling directly from the transmitting transducer 2 to receiving transducer 4, the transducers respond to surface waves reflected from the ends of the substrate. These reflected surface waves produce unwanted signals, for example, as spurious signal in the time domain and/or ripples of the frequency response domain that distort the main, desired signal, adversely affecting the performance of the SAW device.

There have been proposed various methods for suppressing the reflected waves. One method is, as shown in FIG. 1, to apply a rectangular absorbent material 16, 18 to the edges of the substrate adjacent to each transducer. Since the larger the absorbent material area, the higher the reduction of the surface waves, each absorbent material 16, 18 has a length, measured in the direction of propagation of the surface wave, sufficiently long to absorb the unwanted surface waves launched towards the edges of the substrate and reflected from such edges.

Another method is shown in FIG. 2 in which the side edges are skewed relative to the fingers of transducer combs, and thus relative to the principal acoustic response axis, to change the direction of travel of the reflected surface waves for reducing the influence of the reflected surface wave on the transducer.

Although the above described methods effectively suppress the unwanted waves and reflected waves, the application of absorbent material 16, 18 in the manner described above, or the change of the configuration of the substrate result in high manufacturing cost. More particularly, according to the SAW device of FIG. 1, each of the absorbers 16 and 18 occupies a large space in the substrate 6 to substantially enlarge the size of the SAW device. Thus, it is necessary to provide a substrate having a large size. Furthermore, since the absorbers 16 and 18 cover large area over the substrate, they require a large amount of absorbent material. Also, according to the SAW device of FIG. 2, since the substrate 6 is formed in the shape of parallelogram, a parent plate from which the substrates are cut out may not be fully utilized, thus wasting the substrate material.

These and other conventional SAW devices are disclosed in Toda et al's U.S. Pat. No. 4,090,153 issued May 16, 1978, Drummond's U.S. Pat. No. 4,096,455 issued June 20, 1978, and Yamada et al's Japanese Laid Open Patent Publication No. 100253/1976 (corresponding to U.S. Pat. No. 4,139,791 issued Feb. 13, 1979).

Accordingly, a primary object of the present invention is to provide a SAW device in which the unwanted waves and reflected waves can be effectively suppressed with a small amount of absorbent material.

It is another object of the present invention to provide a SAW device of the above described type which is compact in size and can readily be manufactured at low cost.

BRIEF DESCRIPTION OF THE INVENTION

In accomplishing these and other objects, a SAW device according to the present invention comprises a substrate of a material capable of propagating acoustic waves along a surface of the substrate. A transducer means is deposited on the surface of the substrate and includes an interdigitated electrode arranged in accordance with a weighting function. The transducer means is adapted to launch, along a path on the surface of the substrate, acoustic waves having nonuniform energy distribution along the widthwise direction of its propagation. An absorber means is deposited on the surface of the substrate over the path for absorbing the acoustic waves propagating along the path towards the absorber means. The absorber means has an absorbent material spanning a long distance along the path where the acoustic waves having high energy propagate, and short distance along the path where the acoustic waves having low energy propagate.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE PREFERRED EMBODIMENTS

Figure 1:
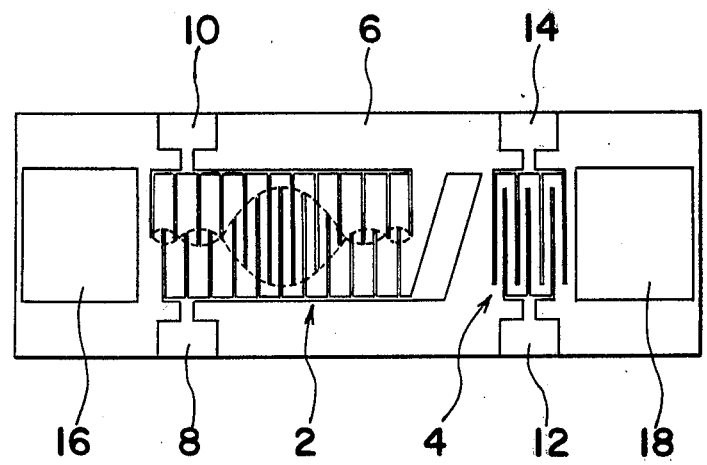
FIGS. 1 and 2 have already been referred to in the foregoing description and are showing top plan views of conventional SAW devices.
Figure 2:
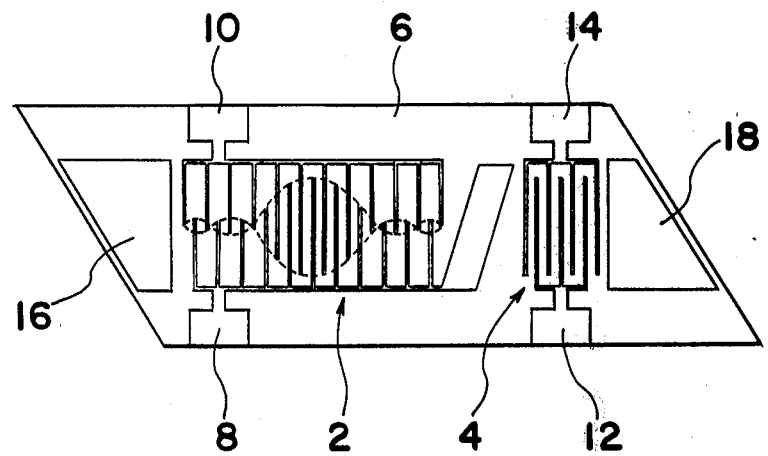
Figure 3:
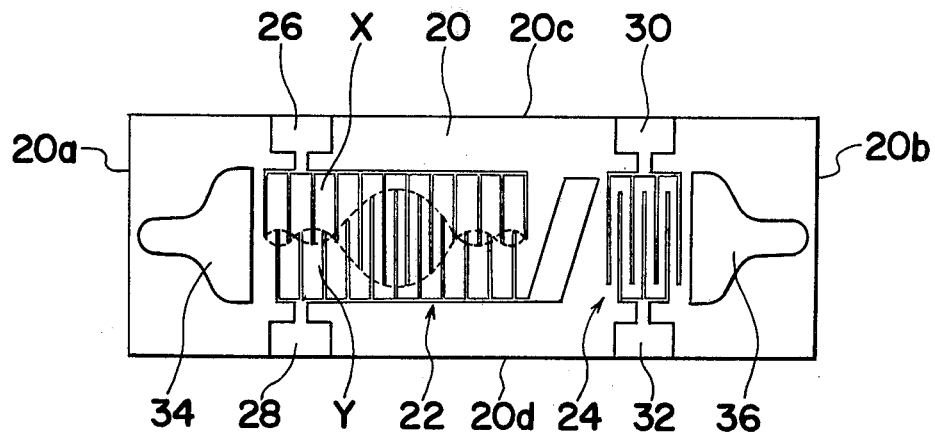
FIG. 3 is a top plan view of a SAW device according to the present invention.

Referring to FIG. 3, one embodiment of a surface acoustic wave (SAW) device of the present invention comprises an elongated rectangular substrate 20 of a piezoelectric material, such as PZT, having opposite end edges 20a and 20b and opposite side edges 20c and 20d. The substrate 20 can be formed by the deposition of a film of piezoelectric material over a dielectric plate, for example, a glass plate. The rectangular substrate 20 has a transmitting transducer 22 and a receiving transducer 24 applied to its upper surface in a known manner. In the embodiment shown, the transmitting transducer 22 includes a pair of thin-film electrodes arranged in the shape of combs with interdigitated teeth. The tips of the comb-shaped electrodes of the transmitting transducer 22 as shown by an envelope line are arranged in a shape similar to rugby balls in accordance with a desired mathematical weighting function. A pair of terminal plates 26 and 28 extend outwardly from the electrodes of the transducer 22 in the direction parallel to the interdigitated teeth and are deposited on the peripheral portions adjacent to the side edges 20c and 20d, respectively, of the substrate 20.

The receiving transducer 24 includes a pair of comb-shaped electrodes of the uniform interdigitated type. A pair of terminal plates 30 and 32 extend outwardly from the electrodes of the transducer 24 in the same manner as the terminal plates 26 and 28 and are also deposited on the peripheral portions adjacent to the side edges 20c and 20d, respectively, of the substrate 20.

Provided on the substrate 20 between the transmitting transducer 22 and the edge 20a of the substrate 20 is an absorber 34 formed by an epoxy resin and deposited thereon by any known method, such as printing. A similar absorber 36 is deposited on the substrate 20 between the receiving transducer 24 and the edge 20b of the substrate 20. Before describing the details of the absorbers, the characteristic of the surface acoustic waves will be described.

Figure 4:
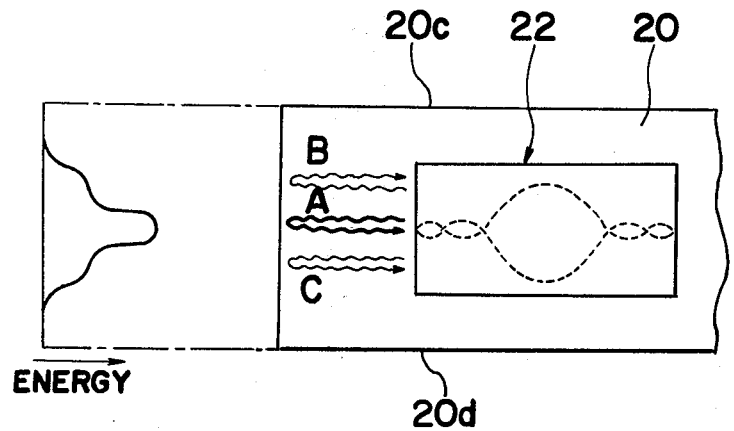
FIG. 4 is a diagrammatic view showing an energy distribution of the acoustic waves in the SAW device of FIG. 3.

When an alternating electrical potential is applied between the terminal plates 26 and 28, an alternating electric field is generated that causes localized vibration in the substrate 20. In the case where the substrate 20 is formed by the piezoelectric film laminated over the dielectric plate, the vibration is produced in the piezoelectric film. These vibrations give rise to acoustic waves, which propagate along a path defined on the surface of the substrate 20 in a direction perpendicular to the teeth of the electrodes. When the radiated energy of surface acoustic waves from the transmitting transducer 22 is measured, the central portion between the comb-shaped electrodes (that is, where the number of interdigitated teeth is greatest) generates surface acoustic waves having highest energy. In other words, the energy of the surface acoustic waves A (FIG. 4) propagating at the central portion of the path is highest and is reduced towards the opposite sides of the path. Therefore, the surface acoustic waves B and C propagating along the opposite sides of the path have relatively small amount of energy. A graph shown in FIG. 4 shows the distribution of surface wave energy along the widthwise direction of the path.

Since the degree of reduction of surface wave energy is in relation to the distance of travel of the surface wave through the absorbent material, the absorber 34 is so shaped as to cover a wide area over the path on the substrate 20 where the surface waves having high energy travel, and cover a narrow area of the path where the surface waves having low energy travel. According to the SAW device of FIG. 3, the absorber 34 is so shaped that the curvature defining the edge thereof facing the end edge 20a of the substrate 20 is similar to the distribution curvature shown in FIG. 4, while the edge of the absorber 34 facing the transmitting transducer 22 has a straight line parallel to the teeth of the comb-shaped electrodes. Accordingly, the absorber 34 has a shape similar to the nipple end portion of a feeding bottle.

In the above arrangement, the surface wave A having high energy looses much of its energy during its travel through the long span portion of the absorber 34, and the surface waves B and C also loose their energy during their travel through the short span portion of the absorber 34. Therefore, the surface waves launched from the transmitting transducer 22 towards the end edge 20a of the substrate 20 will be attenuated to have a considerably smaller energy when they reach the end edge 20a. When the surface waves reaching the end edge 20a are reflected by the end edge 20a back towards the transducer 22, they will be further attenuated by the time they reach the transducer 22 to such a degree that they will not adversely affect the performance of the transducer 22.

Although it is described that the comb-shaped electrodes of the receiving transducer 24 are interdigitated uniformly, they can be interdigitated in accordance with a desired weighting function. In this case, the transmitting transducer 22 may be so designed as to have a uniform interdigitated electrodes.

It is to be noted that the absorber 36 provided adjacent to the receiving transducer 24 functions in a similar manner to the absorber 34.

Furthermore, it is to be noted that either one of the absorbers 34 and 36 can be eliminated or can be replaced by an absorber having a rectangular shape or by an absorber having one side edge skewed relative to the direction of travel of the surface wave. Moreover, it is possible to deposit each of the absorbers in a turned round position in which the nipple end portion points to the respective transducers.

Figure 5:
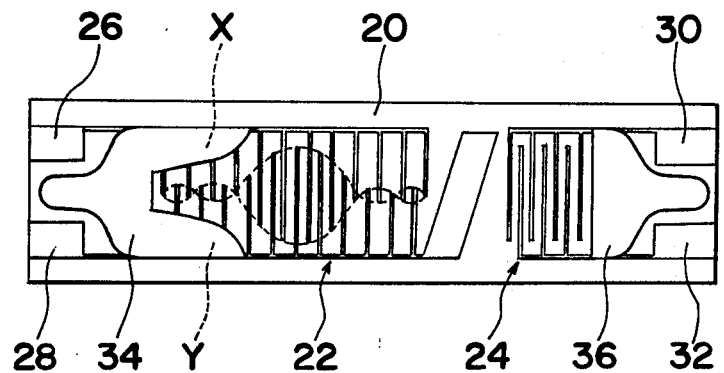
FIG. 5 is a view similar to FIG. 3 but particularly shows a modification thereof.

Referring to FIG. 5, there is shown a modification of the SAW device having terminal plates 26, 28, 30 and 32 deposited adjacent to the absorbers 34 and 36 within the width of the transducers 22 and 24. More particularly, the terminal plates 26 and 28 are located adjacent to the nipple ended tip of the absorber 34 while the terminal plates 30 and 32 are located adjacent to the nipple ended tip of the absorber 36. The electrical connection to the respective terminal plates can be effected by the lead wire (not shown) soldered thereto or by the terminal leg (not shown) soldered thereto directly. According to the SAW device of FIG. 5, since no terminal plate is deposted along the side edges 20c and 20d, it is possible to narrow the width of the substrate 20, thus compacting the size of the SAW device.

Moreover, it is possible to apply the absorbent material over the transmitting transducer 22 at portions X and Y where the teeth are not interdigitating. In this case the absorbent material can be integrally extended from the absorber 34. The absorbent material deposited on the transducer 22 advantageously absorbs the unwanted surface wave reflected by each of the teeth in the comb-shaped electrodes.

Figure 6:
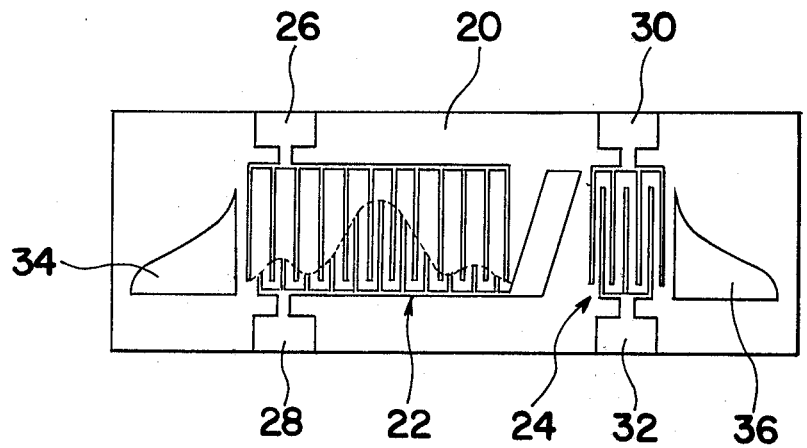
FIG. 6 is a view similar to FIg. 3 but particularly shows another embodiment thereof.
Figure 7:
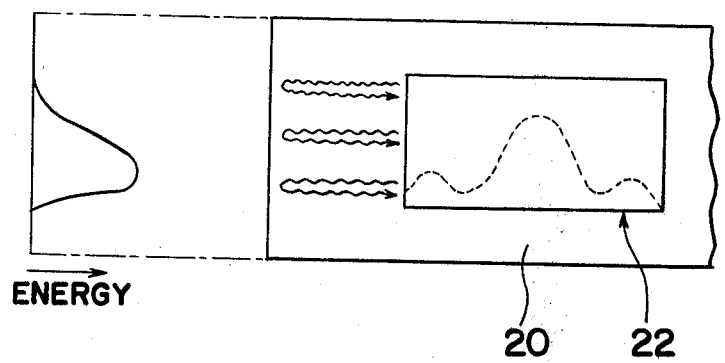
FIG. 7 is a diagrammatic view showing energy distribution of the acoustic waves in the SAW device of FIG. 6.

Referring to FIG. 6, the transmitting transducer 22 in this embodiment has another pattern of interdigitated teeth. The tips of the comb-shaped electrodes as shown by an envelope line are arranged in a shape similar to mountains in accordance with a desired mathematical weighting function. In this case, the energy of surface acoustic waves is greatest at one side portion of the path of the surface wave and is gradually reduced towards the other side portion of the path, as shown by an energy distribution curve in FIg. 7. Accordingly, the absorber 34 of the SAW device of FIG. 6 is so shaped that the curvature defining the edge thereof facing the end edge 20a of the substrate 20 is similar to the distribution curvature shown in FIG. 7, while the edge of the absorber 34 facing the transmitting transducer 22 has a straight line parallel to the teeth of the comb-shaped electrodes. The absorber 36 provided adjacent to the receiving transducer 24 has a shape similar to the absorber 34 described above.

Although the present invention has been fully described with reference to several preferred embodiments, many modifications and variations thereof will now be apparent to those skilled in the art. Therefore, unless such modifications and variations depart from the true scope of the present invention, they should be construed as included therein.

What is claimed is:

1. A surface acoustic wave device, comprising:
a substrate formed of a material capable of propagating acoustic waves along a surface of the substrate;
transducer means deposited on said surface and including a pair of electrodes arranged in the shape of combs having interdigitated teeth, said teeth overlapping each other by varying amounts so as to cause said transducer means to launch, along a path extending in a first direction on said surface, acoustic waves having a continually varying nonuniform energy distribution as measured along a line extending in a second direction perpendicular to said first direction between a first point having a substantially zero energy level to a second point having a substantially zero energy level; and
absorber means deposited on said surface along said path for absorbing acoustic waves propagating along said path towards said absorber means, said absorber means being made of absorbent material, the length of said absorber means as measured along said first direction being longer at areas where acoustic waves having a relatively high energy propagate than the length of said absorber means as measured along said first direction at areas where acoustic waves having a relatively low energy propagate.

2. A surface acoustic wave device as claimed in claim 1, wherein said acoustic waves have high energy at the central portion of said second direction and low energy at the opposite side portions of said second direction.

3. A surface acoustic wave device as claimed in claim 2, wherein said absorbent material spans a long distance at the central portion of said second direction and a short distance at the opposite side portions of said second direction.

4. A surface acoustic wave device as claimed in claim 3, further comprising a pair of terminal plates electrically connected to said transducer means, said terminal plates being deposited on said surface closely adjacent to the long spanning sections of said absorbent material.

5. A surface acoustic wave device as claimed in claim 1, wherein said acoustic waves have high energy at one side portion of said path and low energy at the other side portion of said second direction.

6. A surface acoustic wave device as claimed in claim 5, wherein said absorbent material spans a long distance at said one side portion of second direction and a short distance at said other side portion of second direction.

7. A surface acoustic wave device as claimed in claim 1, wherein said absorbent material extends partly over said transducer means at portions where said electrodes are not interdigitated.

8. A surface acoustic wave device as claimed in claim 1, wherein the length of said absorber means as measured along said first direction is longest at that point where said energy distribution is the greatest and is shortest at that point where said energy distribution is the lowest.

* * * * *